United States Patent
Ding et al.

(10) Patent No.: US 6,856,796 B2
(45) Date of Patent: Feb. 15, 2005

(54) HIGH LINEARITY CIRCUITS AND METHODS REGARDING SAME

(75) Inventors: Yongwang Ding, Minneapolis, MN (US); Ramesh Harjani, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 491 days.

(21) Appl. No.: 10/056,727

(22) Filed: Jan. 25, 2002

(65) Prior Publication Data

US 2002/0126767 A1 Sep. 12, 2002

Related U.S. Application Data

(60) Provisional application No. 60/264,105, filed on Jan. 25, 2001.

(51) Int. Cl.$^7$ .................................................. H09D 1/10
(52) U.S. Cl. ....................... 455/295; 455/326; 455/341; 330/296; 327/359
(58) Field of Search ............................... 455/295, 296, 455/303, 130, 132, 133, 137, 140, 143, 333, 334, 323, 326, 313, 317, 318, 341; 325/349; 327/359, 386, 398, 355, 357; 330/296, 285

(56) References Cited

U.S. PATENT DOCUMENTS

| | | | |
|---|---|---|---|
| 3,202,928 A | | 8/1965 | Prior |
| 4,146,844 A | | 3/1979 | Quinn |
| 4,392,252 A | | 7/1983 | Cluniat |
| 5,043,673 A | | 8/1991 | Suematsu et al. |
| 5,523,717 A | | 6/1996 | Kimura |
| 5,589,791 A | | 12/1996 | Gilbert |
| 5,768,700 A | | 6/1998 | Kardontchik |
| 6,175,279 B1 | | 1/2001 | Ciccarelli et al. |
| 6,278,872 B1 | * | 8/2001 | Poulin et al. ............... 455/333 |
| 6,335,651 B1 | * | 1/2002 | Fayyaz ........................ 327/359 |
| 6,345,178 B1 | * | 2/2002 | Haapala ....................... 455/326 |
| 6,472,925 B1 | * | 10/2002 | Komurasaki et al. ....... 327/361 |
| 6,639,447 B2 | * | 10/2003 | Manku et al. ............... 327/359 |

FOREIGN PATENT DOCUMENTS

EP 0 340 439 A2 3/1989

OTHER PUBLICATIONS

Ding et al., "A+18dBm IIP3 LNA in 0.35 μm CMOS," *2001 IEEE Intl Solid–State Circuits Conference: Digest of Technical Papers*, Feb. 2001; 44:102–103, & 443.

Floyd et al., "A 900–MHz, 0.8–μm CMOS Low Noise Amplifier with 1.2dB Noise Figure," *Proceedings of the IEEE 1999 Custom Integrated Circuits Conference*, Town and Country Hotel, San Diego, CA, May 16–19, 1999; 661–664.

Fong, "TP 13.3 Dual–Band High–Linearity Variable–Gain Low–Noise Amplifiers for Wireless Applications," *IEEE 1999 Int. Solid–State Circuits Conf.: Digest of Technical Papers*, 1999; 224–225.

Haung et al., "Broadband, 0.25 μm CMOS LNAs with Sub–2dB NF for GSM Applications," *Proceedings of the 1998 IEEE Custom Integrated Circuits Conference*, Westin Hotel, Santa Clara Convention Center, May 11–14, 1998; 67–70.

Karanicolas, "A 2.7–V 900 MHz CMOS LNA and Mixer," *IEEE Journal of Solid–State Circuits*, Dec. 1996; 31(12):1939–1944.

(List continued on next page.)

*Primary Examiner*—Pablo N. Tran
(74) *Attorney, Agent, or Firm*—Mueting, Raasch & Gebhardt, P.A.

(57) ABSTRACT

Circuits and methods that improve linearity with use of cancellation of at least a portion, and preferably, substantially all of, at least one significant harmonic from the output of a primary circuit, e.g., the 3$^{rd}$ harmonic, using the output of a substantially functionally identical auxiliary circuit.

75 Claims, 11 Drawing Sheets

OTHER PUBLICATIONS

Kim et al., "A Fully Integrated 1.9–GHz CMOS Low–Noise Amplifier," *IEEE Microwave and Guided Wave Letters,* Aug. 1998; 8(8): 293–295.

Krummenacher et al., "A 4–MHz CMOS Continuous–Time Filter with On–Chip Automatic Tuning," *IEEE Journal of Solid–State Circuits,* Jun. 1988; 23(3):750–758.

Lin et al., "Design of MMIC LNA for 1.9GHz CDMA Portable Communication," *1998 Int'l Conf. on Microwave & Millimeter Wave Tech. Proceed.,* Liao ed., Bejing, China, Aug. 18–20, 1998; 205–208.

Lucek et al., "Designing an LNA for a CDMA front end," *RF Design,* Feb. 1999; 22(2):20–30. [online]. PRIMEDIA Business Magazines & Media. [retrieved on Aug. 2, 2002]. Retrieved from the Internet: <URL:http//images.rfdesign.com/files/4/0299Lucek20.pdf>. (6 pgs).

Meyer et al., "A 1–GHz BiCMOS RF Front–End IC," *IEEE Journal of Solid–State Circuits,* Mar. 1994; 29(3):350–355.

Moroney et al., "A High Performance Switched–LNA IC for CDMA Handset Receiver Applications," *1998 IEEE Radio Frequency Integrated Circuits (RFIC) Symposium,* Mondal ed., 1998; 43–46.

Nedungadi et al., "Design of Linear CMOS Transconductance Elements," *IEEE Trans. on Circuits and System,* Oct. 1984; 31(10):891–894.

Park et al., "A High–Frequency CMOS Linear Transconductance Element," *IEEE Trans. on Circuits and System.,* Nov. 1986; 33:1132–1138.

Ray et al., "A Highly Linear Bipolar 1 V Folded Cascode 1.9GHz Low Noise Amplifier," *Proc. of the 1999 Bipolar/BiCMOS Circuits and Tech. Meeting,* 1999; 157–160.

Rodgers et al., "Silicon UTSi® CMOS RFIC for CDMA Wireless Communications Systems," *1999 IEEE Radio Frequency Integrated Circuits (RFIC) Symposium,* Moniz ed., 1999; 181–184.

Seevinck et al., "A Versatile CMOS Linear Transconductor/Square–Law Function Circuit," *IEEE Journal of Solid–State Circuits,* Jun. 1987: 22(3):366–377.

Shaeffer et al., "A 1.5–V, 1.5–Ghz CMOS Low Noise Amplifier," *IEEE Journal of Solid–State Circuits,* May 1997; 32(5):745–759.

Shahani et al., "A 12–mW Wide Dynamic Range CMOS Front–End for a Portable GPS Receiver," *IEEE Journal of Solid–State Circuits,* Dec. 1997; 32(12):2061–2070.

Snelgrove et al., "A Balanced 0.9–$\mu$m CMOS Transconductance–C Filter Tunable over the VHF Range," *IEEE Journal of Solid–State Circuits,* Mar. 1992; 27(3):314–323.

Soorapanth et al., "RF Linearity of Short–Channel MOSFETs" *First International Workshop on Design of Mixed–Mode Integrated Circuits and Applications,* Jul. 1997; 81–84. [online]. Stanford University. [retrieved on Aug. 2, 2002]. Retrieved from the Internet: <URL:http://www-smirc.stanford.edu/papers/cancun97s–chet.pdf>. (4 pgs.).

Wang et al., "A Voltage–Controllabe Linear MOS Transconductor Using Bias Offset Technique," *IEEE Journal of Solid–State Circuits,* Feb. 1990; 25(1):315–317.

Welland et al., "FA 17.1: A Digital Read/Write Channel with EEPR4 Detection," *1994 IEEE Int. Solid–State Circuits Conf.: Digest of Technical Papers,* 1994; 276–277.

Wong, "Novel Drain–Based Transconductance Building Blocks for Continuous–Time Filter Applications," *Electron. Lett.,* Jan. 19 1989; 25(2):100–101.

Zhou et al., "FA 8.6: A Fully Integrated CMOS 900MHz LNA Utilizing Monolithic Transformers," *1998 IEEE Int. Solid–State Circuits Conf.: Digest of Technical Papers,* 1998; 132–133.

\* cited by examiner (with magnitude mismatch 0dB-0.1B-0.2dB-0.5dB-1dB-3dB)

(with magnitude mismatch 0dB−0.3dB−1dB−3dB−10dB)

HIGH LINEARITY CIRCUITS AND METHODS REGARDING SAME

CROSS-REFERENCE TO RELATED APPLICATIONS

This application claims the benefit of U.S. Provisional Application No. 60/264,105, entitled "HIGH LINEARITY CIRCUITS AND METHOD REGARDING SAME," filed Jan. 25, 2001, wherein such document is incorporated herein by reference.

TECHNICAL FIELD OF THE INVENTION

The present invention relates generally to electrical circuits. More particularly, the present invention pertains to high linearity circuits, such as, for example, those employed in analog circuits, e.g., low noise amplifiers.

BACKGROUND OF THE INVENTION

High linearity circuits are required in a large number of systems, such as receivers and transmitters of communication systems, and analog-to-digital (A/D) conversion systems. Circuit nonlinearity causes many problems. For example, circuit nonlinearity limits a system's spurious-free dynamic range (SFDR). As a result, a system's accuracy is limited. A highly linear design can not only improve a circuit's SFDR, but can also reduce power consumption.

High linearity circuits are very important in most analog systems. Particularly, in communication systems, linearity is one of the primary specifications, and is characterized by the parameter known as the third order intercept point (IP3).

The design of communication systems, e.g., the design of a high performance receiver, is made challenging by various design constraints. First, high performance is required for many applications. High performance can be described by the linearity of the active devices (e.g., amplifiers, mixers, etc.) and the noise figure of the receiver. Second, for some applications such as in a cellular communication system, power consumption is an important consideration because of the portable nature of the receiver. Generally, high performance and high efficiency are conflicting design considerations.

An active device, such as a low noise amplifier, has the following transfer function:

$$y(x) = a_1 \cdot x + a_2 \cdot x^2 + a_3 \cdot X^3 + \text{higher order terms},$$

where x is the input signal, y(x) is the output signal, and $a_1$, $a_2$, and $a_3$ are coefficients which define the linearity of the active device. For simplicity, higher order terms (e.g., terms above third-order) are ignored. For an ideal active device, the coefficients $a_2$ and $a_3$ are 0.0 and the output signal is simply the input signal scaled by $a_1$. However, all active devices experience some amount of nonlinearity which is quantified by the coefficients $a_2$ and $a_3$. Coefficient $a_2$ defines the amount of second order nonlinearity and coefficient $a_3$ defines the amount of third-order nonlinearity.

Most communication systems are narrow band systems which operate on an input RF signal having a predetermined bandwidth and center frequency. The input RF signal typically comprises other spurious signals located throughout the frequency spectrum. Nonlinearity within the active devices causes intermodulation of spurious signals, resulting in products which may fall into the signal band.

The effect of second order nonlinearity (e.g., those caused by the $x^2$ term) can usually be reduced or eliminated by careful design methodology, e.g., differential design techniques. Second order nonlinearity produces products at the sum and difference frequencies. Typically, the spurious signals which can produce in-band second-order products are located far away from the signal band and can be easily filtered.

However, third-order nonlinearity is more problematic. For third-order nonlinearity, spurious signals $x = g_1 \cdot \cos(w_1 t) + g_2 \cdot \cos(w_2 t)$ produce products at the frequencies $(2w_1 - w_2)$ and $(2w_2 - w_1)$. Thus, near band spurious signals (which are difficult to filter) can produce third-order intermodulation products that fall in-band, causing degradation in the received signal. To compound the problem, the amplitude of the third-order products are scaled by $g_1 \cdot g_2^2$ and $g_1^2 \cdot g_2$. Thus, every doubling of the amplitude of the spurious signals produces an eight-fold increase in the amplitude of the third-order products. Viewed another way, every 1 dB increase in an input RF signal results in 1 dB increase in the output RF signal but 3 dB increase in the third-order products.

The linearity of a receiver (or the active device) can be characterized by the input-referred third-order intercept point (IIP3). Typically, the output RF signal and the third-order intermodulation products are plotted versus the input RF signal. As the input RF signal is increased, the IIP3 is a theoretical point where the desired output RF signal and the third-order products become equal in amplitude. The IIP3 is an extrapolated value since the active device goes into compression before the IIP3 point is reached.

For a receiver comprising multiple active devices connected in cascade, the IIP3 of the receiver from the first stage of active device to the $n^{th}$ stage can be calculated as follows:

$$IIP3_n = -10 \cdot \log_{10}[10^{-IIP3_{n-1}/10} + 10^{(AP_n - IIP3_{dn})/10}]$$

where $IIP3_n$ is the input-referred third-order intercept point from the first stage of active device to the $n^{th}$ stage, $IIP3_{n-1}$ is the input-referred third-order intercept point from the first stage to the $(n-1)^{th}$ stage, $Ap_n$ is the power gain from the first stage to the $n^{th}$ stage, $IIP3_{dn}$ is the input-referred third-order intercept point of the $n^{th}$ stage, and all terms are given in decibel (dB). The calculation in the above equation can be carried out in sequential order for subsequent stages within the receiver.

In summary, nonlinearity in a communication system causes many problems, including, for example, cross-modulation, inter-modulation, gain compression, and desensitization.

Further, analog CMOS designs are highly desirable as CMOS is one of the most prevalent technologies used for digital circuits. This is particularly the case for digital circuits in wireless communication systems where power is a primary consideration. However, conventional CMOS designs are generally not suitable for high performance requirements, e.g., high linearity systems, for many communications systems, e.g., CDMA, W-CDMA, and OFDM wireless systems.

To meet high performance requirements, at some stages of the communication systems, such as low noise amplifier stages, mixer stages, and power amplifier stages, bipolar or GaAs heterojunction bipolar transistors (HBT) have been used to meet the high performance requirements. Such designs generally are not easily incorporated with other digital circuits on the same chip. As such, product cost increases significantly due to the use of the multiple technologies. In addition, power considerations become problematic.

Further, several CMOS transconductor circuits have been used to improve circuit linearity. For example, in D. R.

Welland, et al., "A Digital Read/Write Channel with EEPR4 Detection," *IEEE Int. Solid-State Circuits Conf.*, 1994, pp. 276–277, a fixed-bias triode transistor is utilized to realize an input CMOS pair with moderate linearity. In F. Krummenacher and N. Joehl, "A 4-MHz CMOS Continuous-Time Filter with On-Chip Automatic Tuning," *IEEE Journal of Solid-State Circuits*, vol. 23, pp. 750–758, June 1988, a transconductor circuit is proposed by using a pair of varying bias transistors. An extra opamp is used in S. L. Wang, "Novel Drain-Based Transconductance Building Blocks for Continuous-Time Filter Applications," *Electron. Lett.*, vol. 25, no. 2, pp. 100–101, January 1989, to create a Gm-C opamp integrator.

Further, other CMOS pairs have been proposed to realize transconductors such as described in E. Seevinck and R. F. Wassenaar, "A Versatile CMOS Linear Transconductor/Square-Law Function Circuit," *IEEE Journal of Solid-State Circuits*, vol. 22, pp. 366–377, June 1987; W. M. Sneigrove and A. Shoval, "A Balanced 0.9-um CMOS Transconductance-C Filter Tunable over the VHF Range," *IEEE Journal of Solid-State Circuits*, vol. 27, pp. 314–323, March 1992; C. S. Park and R. Schaumann, "A High-Frequency CMOS Linear Transconductance Element," *IEEE Trans. on Circuits and System*, vol. 33, pp. 1132–1138, November 1986; A. Nedungadi and T. R. Viswanathan, "Design of Linear CMOS Transconductance Elements," *IEEE Trans. on Circuits and System*, vol. 31, pp. 891–894, October 1984; and Z. Wang and W. Guggenbuhl, "A Voltage-Controllable Linear MOS Transconductor Using Bias Offset Technique," *IEEE Journal of Solid-State Circuits*, vol. 25, pp. 315–317, February 1990. However, such transconductors do not operate at sufficiently high frequencies, e.g., in gigahertz frequencies. Further, such transconductors do not meet the high linearity requirements of modern communication systems.

The techniques described above have been proposed to improve the linearity of CMOS circuits. However, for example, low noise amplifiers used in wireless communication systems need to have low noise, high linearity, and sufficient gain. Although CMOS is the technology of choice in terms of digital integration, it is seldom preferred for high performance circuits such as low noise amplifiers due to its limited ability in handling interference and because it generally is not suitable for the high performance requirements of various communication systems, such as first tier wireless systems, e.g., CDMA, and W-CDMA.

As such, there is a continuing need, with respect to various electronic systems and, in particular, communication systems, for improved system linearity. For example, improvement in system linearity, e.g., IIP3, of transceiver front ends in communication systems is needed.

SUMMARY OF THE INVENTION

The present invention can be used to build high linearity circuits, e.g., circuits designed with digital CMOS processes. The present invention provides a novel technique for providing high linearity circuits. In general, the technique relies on canceling at least a portion of at least one significant harmonic of the circuit, e.g., the $3^{rd}$ harmonic.

A method to improve linearity in electrical circuitry according to the present invention includes providing a primary circuit and at least one auxiliary circuit. The at least one auxiliary circuit is substantially functionally identical to the primary circuit. A first input signal is applied to the primary circuit resulting in a first output signal and a second input signal is applied to the auxiliary circuit resulting in a second output signal. The second input signal has an amplitude that is different than the first input signal. At least a portion of at least one harmonic of the first output signal is cancelled using the second output signal, e.g., at least a portion of a third harmonic of the first output signal is cancelled using the second output signal.

In another embodiment, the second input signal is the first input signal with β times gain. Further, canceling at least a portion of at least one harmonic of the first output signal using the second output signal may include subtracting $1/\beta^3$ of the second output signal from the first output signal.

A circuit apparatus according to the present invention includes a primary circuit operable to receive a first input signal and generate a first output signal. The circuit apparatus further includes at least one auxiliary circuit. The at least one auxiliary circuit is substantially functionally identical to the primary circuit. The auxiliary circuit is operable to receive a second input signal and generate a second output signal. The second input signal has an amplitude that is different than the first input signal. Further, the auxiliary circuit is connected to the primary circuit so as to result in cancellation of at least a portion of at least one harmonic of the first output signal using the second output signal, e.g., cancellation of at least a portion of a third harmonic of the first output signal using the second output signal.

In one embodiment of the apparatus, a gain circuit provides β times gain to the first input signal resulting in the second input signal. In another embodiment, the gain circuit provides the first input signal by dividing a signal provided as the second input signal by β such that the ratio of the second input signal to the first input signal is β.

In yet another embodiment of the apparatus, a ratio of the second input signal to the first input signal is β, and further the auxiliary circuit is connected to the primary circuit so as to result in subtraction of $1/\beta^3$ of the second output signal from the first output signal.

Another method according to the present invention includes providing a primary circuit and at least one auxiliary circuit. The at least one auxiliary circuit is substantially functionally identical to the primary circuit. An input signal is applied to the primary circuit resulting in an output signal. The at least one auxiliary circuit is used to cancel at least a portion of at least one harmonic of the output signal of the primary circuit.

In other embodiments of the apparatus and methods, multiple auxiliary circuits are used. Each of the multiple auxiliary circuits may be used to cancel at least a portion of a harmonic of the first output signal of the primary circuit.

In various other embodiments of the apparatus and methods, the primary circuit and the at least one auxiliary circuit may include differentially designed circuits, may include amplifier circuits, may include frequency conversion circuits, or may include switched capacitor circuits. Such circuits may be used in communication systems.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

DETAILED DESCRIPTION OF THE EMBODIMENTS

The present invention shall be generally described with reference to at least FIG. 1. Thereafter, various embodiments of the present invention and more details regarding such embodiments shall be provided and described with reference to FIGS. 2–12.

Figure 1:
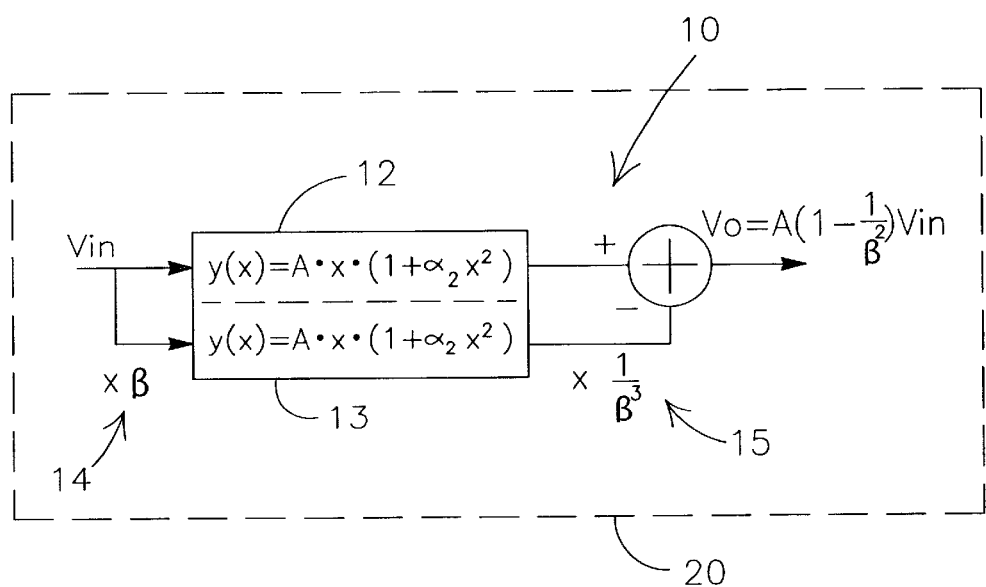
FIG. 1 is a general block diagram of a circuit apparatus according to the present invention for use in a generalized system.

FIG. 1 shows generally a circuit apparatus 10 having high linearity according to the present invention used in a system 20. The circuit apparatus 10 employs a technique to provide high linearity.

Generally, the basic technique relies on canceling at least a portion, and preferably, substantially all of, the most significant harmonic from the output of a primary circuit 12 having an input $V_{in}$ provided thereto, e.g., the most significant harmonic typically being the $3^{rd}$ harmonic. The nonlinear primary circuit 12 can be modeled as an imperfect linear, time-invariant (LTI) system with $3^{rd}$ harmonic, as follows:

$$y(x) = A \cdot x \cdot (1 + a_2 \cdot x^2)$$

Generally, an auxiliary input signal which is $V_{in}$ times gain ($\beta$) (see reference numeral 14) is also passed through an auxiliary circuit 13 that is substantially functionally identical to the primary circuit 12 (i.e., a system having substantially the same functionality). As used herein, substantially functionally identical refers to two circuits that perform the same function, or in other words, have the same transfer characteristics, i.e., the same non-linear characteristics. For example, in the imperfect linear, time-invariant (LTI) system above, $x \cdot (1+a_2 \cdot x^2)$ is the transfer characteristic that is the same in the primary and auxiliary circuits. The coefficient A need not be the same.

The $3^{rd}$ harmonic can be cancelled by subtracting $1/\beta^3$ of the auxiliary output (i.e., output of the auxiliary circuit 13) (see reference numeral 15) from the primary output (i.e., output of the primary circuit 12). This can be expressed as follows:

$$y_{pri}(x) = A \cdot x \cdot (1 + a_2 \cdot x^2)$$

$$y_{aux}(\beta x) = A \cdot \beta \cdot x \cdot (1 + a_2 \beta^2 \cdot x^2)$$

$$y(x) = y_{pri}(x) - \frac{1}{\beta^3} \cdot y_{aux}(\beta x)$$

$$= A \cdot \left(1 - \frac{1}{\beta^2}\right) \cdot x$$

Theoretically, the $3^{rd}$ harmonic caused by the third-order power term can be completely cancelled, and hence the improvement in linearity is infinite. However, in practice, the nonlinearity cancellation is limited by device mismatch, higher power order terms (i.e., those $\geq 5$), and load nonlinearity. For example, with use of current processes, 1% device matching can generally be obtained. Therefore, the output linearity may be improved by up to 40 dB if the higher order power terms are ignored; this is generally the case for smaller signals, e.g., signals used in communication systems.

Although the auxiliary circuit 13 consumes additional power and suppresses the gain of the main primary circuit 12, the impact is small compared to the potential improvement in linearity. The amount of gain suppression is given by $\Gamma$ as shown by:

$$\Gamma = 1 - \frac{1}{\beta^2}$$

The power consumption of the auxiliary circuit 13 depends on the subtraction factor $(1/\beta^3)$ at the output thereof. The power efficiency $\eta$ is defined as the ratio of the main circuit power over the total power, which is given by:

$$\eta = \frac{1}{1 + \frac{1}{\beta^3}}$$

For example, when $\beta$ is selected to be 2 for easier matching, the gain suppression is only ¾, or −2.5 dB, and the power efficiency is 89%.

In an exemplary CMOS low noise amplifier design, for which further detail is provided below, there is a tradeoff between linearity and power consumption. For example, the linearity (e.g., IIP3) of short-channel MOSFETs versus power consumption is known and is shown by curve 32 in FIG. 3. By applying the present harmonic cancellation technique to the short-channel MOSFETs, a new IIP3 vs. power consumption graph can be drawn, as plotted by line 30 in FIG. 3. Please note that in this exemplary design, the present invention not only saves power consumption by several orders of magnitude for the same IIP3 specification, but it is feasible for MOSFET-based low noise amplifiers to meet high IIP3 requirements in a low voltage process, e.g., a low power CMOS design process.

Circuit apparatus 10 utilizing the concepts of the present invention as generally shown in FIG. 1 may be used in a variety of different systems 20. The present invention is not limited to any particular type of circuit apparatus 10, nor to any particular type of the system 20 in which it is used. The present invention can be used to build high linearity circuits using various processes including any pure digital CMOS processes. The present invention provides a new technique to design a high linearity circuit using a completely different approach than conventionally used. Although the present application provides description with reference to low noise amplifiers and several other types of circuits, the present invention may be used for improvement of linearity of any circuit at any operating frequency. For example, as described herein, the harmonic compressed linearization techniques described herein may be used not only with amplifier configurations but also with frequency conversion circuits (e.g., the mixer described with reference to FIG. 11) and switched capacitor circuits (e.g., the enhanced linear switched capacitor integrator described with reference to FIG. 12).

The system 20 which employs the circuit apparatus 10 using the harmonic compressed linearization techniques described herein may be any system that is provided benefit by such techniques. For example, in particular, communication systems, e.g., wireless communication systems, can benefit by employing the circuit apparatus 10 described herein. One illustrative embodiment of a receiver architecture 500 of a communication system incorporating the present invention is described with reference to FIG. 2.

Figure 2:
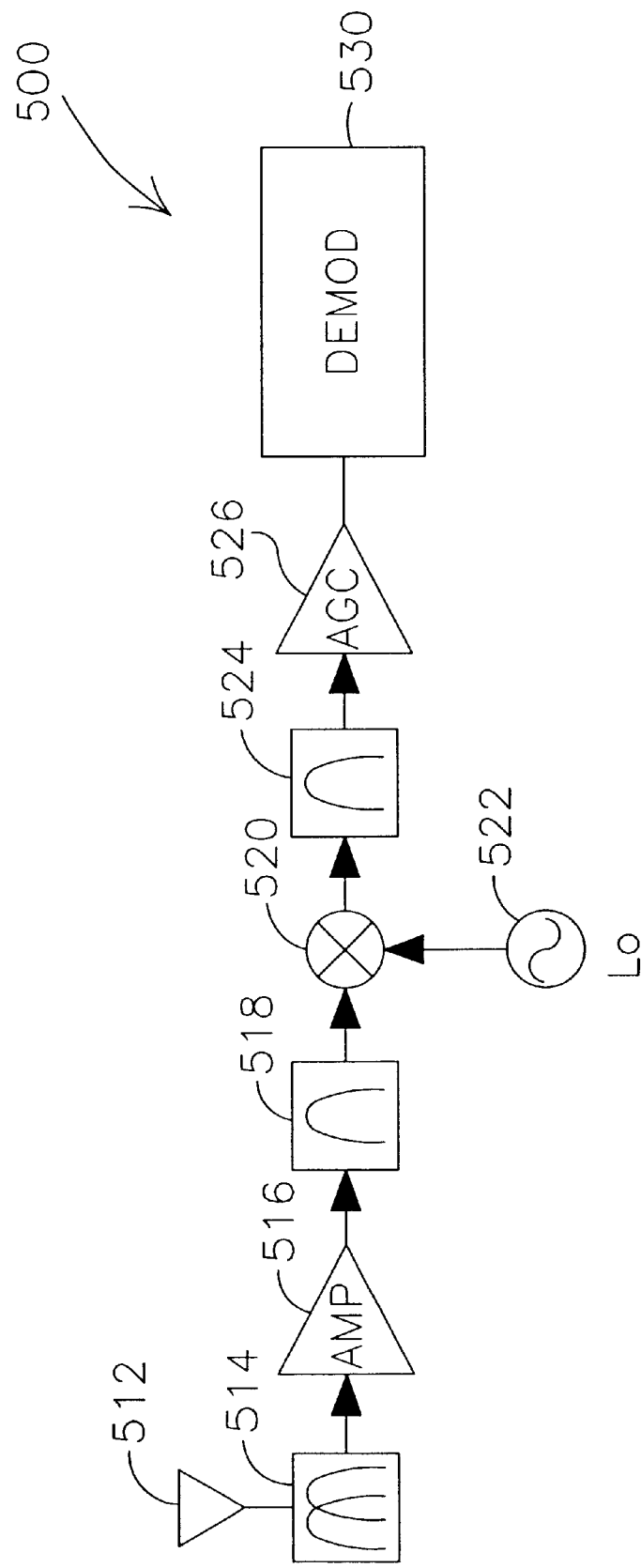
FIG. 2 shows a block diagram of one illustrative portion of an exemplary communication system in which a circuit apparatus as generally shown in FIG. 1 may be used.
Figure 3:
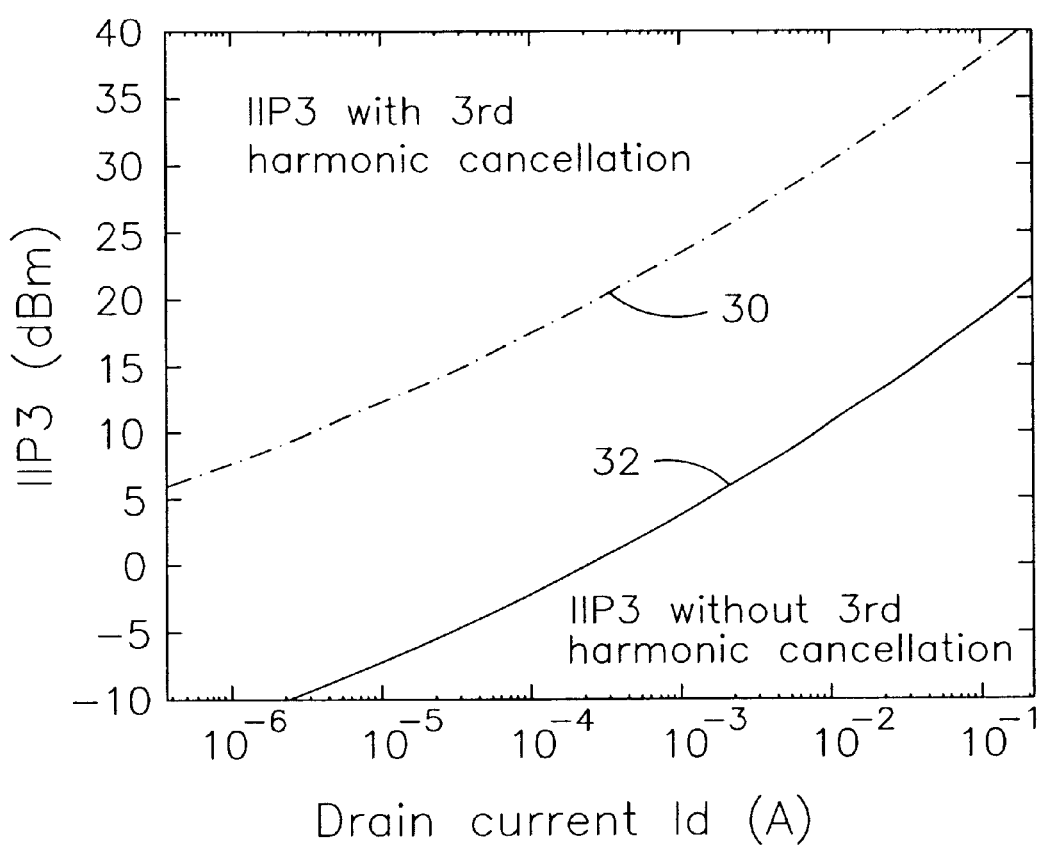
FIG. 3 is a graph showing the comparison between a MOS device with and without $3^{rd}$ harmonic cancellation for use in describing the generalized circuit apparatus shown in FIG. 1.

As shown in FIG. 2, within receiver 500, the transmitted RF signal is received by antenna 512, routed through duplexer 514, and provided to low noise amplifier 516, e.g., a low noise amplifier according to the present invention. Low noise amplifier 516 amplifies the RF signal and provides the signal to bandpass filter 518. Bandpass filter 518 filters the signal to remove some of the spurious signals which can cause intermodulation products in the subsequent stages.

The filtered signal is provided to mixer 520 (e.g., a mixer according to the present invention) which down-converts the signal to an intermediate frequency (IF) with the sinusoidal from local oscillator 522. The IF signal is provided to bandpass filter 524 which filters spurious signals and down-conversion products prior to the subsequent down-conversion stage. The filtered IF signal is provided to automatic-gain-control (AGC) amplifier 526 which amplifies the signal with a variable gain to provide an IF signal at the required amplitude.

The IF signal is provided to demodulation circuitry 530 which demodulates the signal in accordance with the modulation format used at the transmitter. For example, for digital transmission such as binary phase shift keying (BPSK), quaternary phase shift keying (QPSK), offset quaternary phase shift keying (OQPSK), and quadrature amplitude modulation (QAM), a digital demodulator may be used to provide the digitized baseband data.

As described above, a mixer utilizing the cancellation techniques described herein and/or any low noise amplifier design also using the cancellation techniques described herein may be used in the above-described receiver 100 of a communication system. One skilled in the art will recognize that any desired communication systems' components may incorporate the techniques used in the design of the circuit apparatus 10 described herein.

Figure 4A:
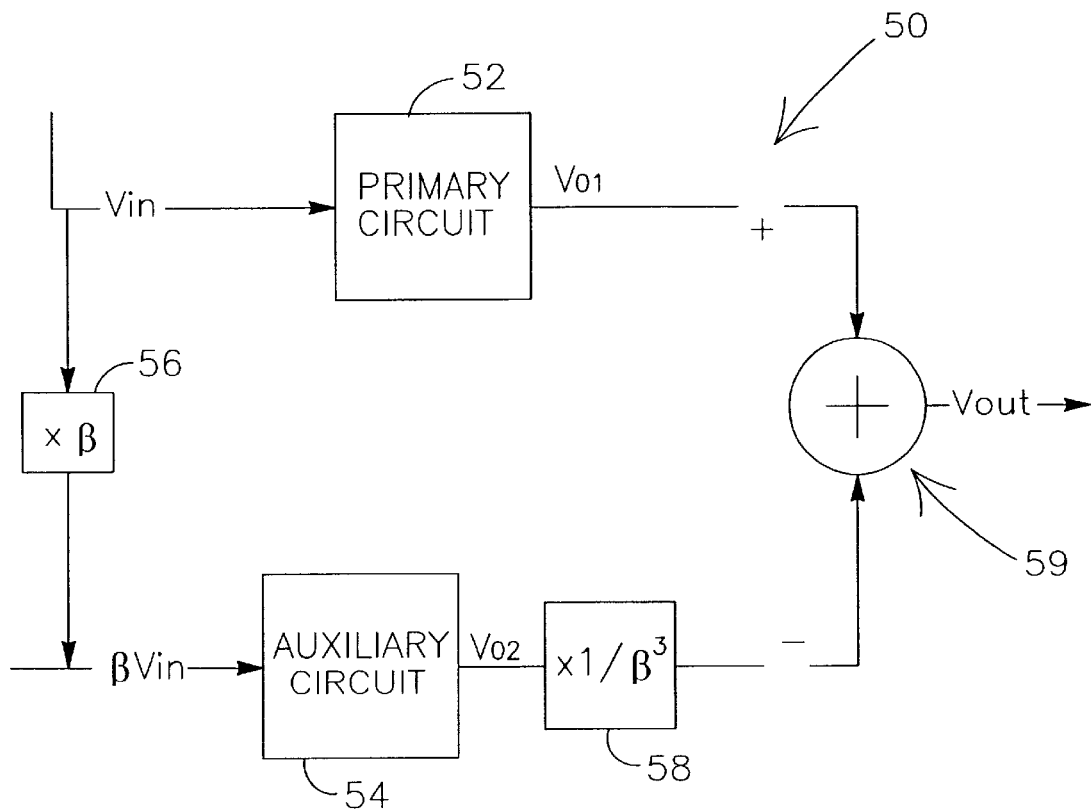
FIG. 4A is one illustrative block diagram representation of an exemplary embodiment of a circuit apparatus according to the present invention generally shown in FIG. 1.

FIG. 4A shows a more detailed block diagram of one exemplary embodiment of a circuit apparatus 50 incorporating the techniques of the present invention previously described generally with reference to FIG. 1. Generally, the circuit apparatus 50 includes a primary circuit 52 and an auxiliary circuit 54.

The primary circuit 52 may be a circuit that provides one of various different types of functionality. For example, the primary circuit may be an amplification circuit, a frequency conversion circuit, a switched capacitor circuit, or any other circuit that would benefit from the linearization techniques described herein.

Generally, the primary circuit 52 has an input $V_{in}$ applied thereto which results in an output $V_{out}$. When an input signal is applied to an imperfect circuit, e.g., primary circuit 52, unwanted signal harmonics generally cause nonlinearity. By using a fully differential design, all even order harmonics can be reduced. Therefore, preferably, the primary circuit 52, as well as the auxiliary circuit 54, is a circuit which utilizes differential design. Further, at least in one preferred embodiment, the primary circuit is implemented with CMOS technology.

Although a differential design can reduce even order harmonics from the output of primary circuit 52, there are still undesirable odd order harmonics. Particularly undesirable, as previously described herein, is the $3^{rd}$ harmonic.

The present invention may be used to cancel at least a portion of the $3^{rd}$ harmonic. However, the present invention can be extended to cancel any other odd harmonic or a portion thereof. Further, also even harmonics may be cancelled, if necessary, when a differential design is not used. In other words, generally, the present invention may be used to cancel portions of, or ideally all of, any order harmonics. For example, multiple auxiliary circuits may be used according to the present invention. Each of the multiple auxiliary circuits may be operably connected for use in canceling at least a portion of at least one harmonic of the output of the primary circuit. For simplicity, the present description focuses on the $3^{rd}$ harmonic.

To remove at least a portion of the $3^{rd}$ harmonic according to the present invention, the circuit apparatus 50 cancels at least a portion of the $3^{rd}$ harmonic by using two in-phase but different amplitude inputs to two substantially functionally identical circuits, and then subtracting the $3^{rd}$ harmonic at the output. In other words, the circuit apparatus 50 includes primary circuit 52 which is substantially functionally identical to auxiliary circuit 54.

Generally, the primary circuit 52 can be represented by the following equation:

$$H(V_{in}) = \frac{V_o}{V_{in}} = a_0 \cdot (1 + a_2 V_{in}^2)$$

This equation defines a nonlinear system with only the $3^{rd}$ harmonic. The remainder of the harmonics are ignored.

By providing two different inputs $V_{in}$ and $\beta V_{in}$ to two substantially functionally identical circuits, two outputs $V_{o1}$ (i.e., the output of primary circuit 52), and $V_{o2}$ (i.e., the output of the auxiliary circuit 54) are obtained. The two outputs $V_{o1}$ and $V_{o2}$ have different $3^{rd}$ harmonic amplitudes, as shown in the following equations:

$$V_{o1}(V_{in}) = a_0 V_{in} \cdot (1 + a_2 V_{in}^2)$$

$$V_{o2}(\beta V_{in}) = a_0 \beta V_{in} \cdot (1 + a_2 \beta^2 V_{in}^2)$$

By multiplying $V_{o1}$ by $\beta^3$, then subtracting $V_{o2}$ (or in other words by subtracting $1/\beta^3$ of $V_{o2}$ from the output $V_{o1}$), then the $3^{rd}$ harmonic can be cancelled, as is shown in the following equation:

$$V_0 = \beta^3 V_{o1} - V_{o2} = a_0(\beta^3 - \beta)V_{in}$$

Of course, as described previously herein, the $3^{rd}$ harmonic cannot be completely cancelled as leftover $3^{rd}$ harmonic depends on the matching between the two signal paths and high power order contributions, e.g., contributions from $\geq 5^{th}$ order harmonics.

As shown in FIG. 4A, the application of $\beta V_{in}$ to the auxiliary circuit 54 is shown by gain circuit 56. The gain circuit 56 may be implemented in any known manner.

Figure 4B:
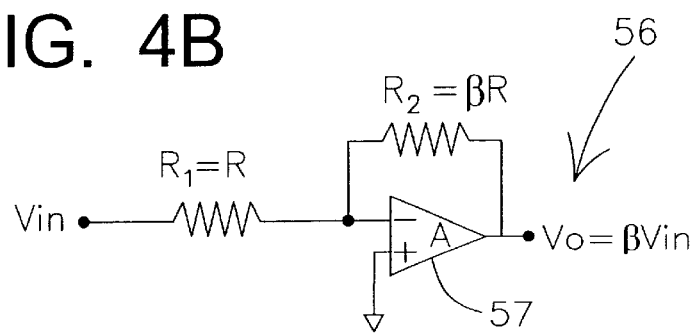
FIG. 4B is one illustrative block diagram representing an exemplary embodiment of a circuit apparatus to provide inputs with different magnitude to the primary and auxiliary circuits of FIG. 4A.

For example, an amplifier 57 with two resistors $R_1 = R$ and $R_2 = \beta R$ may be used to generate $\beta V_{in}$ from $V_{in}$ as shown in FIG. 4B.

Figure 4C:
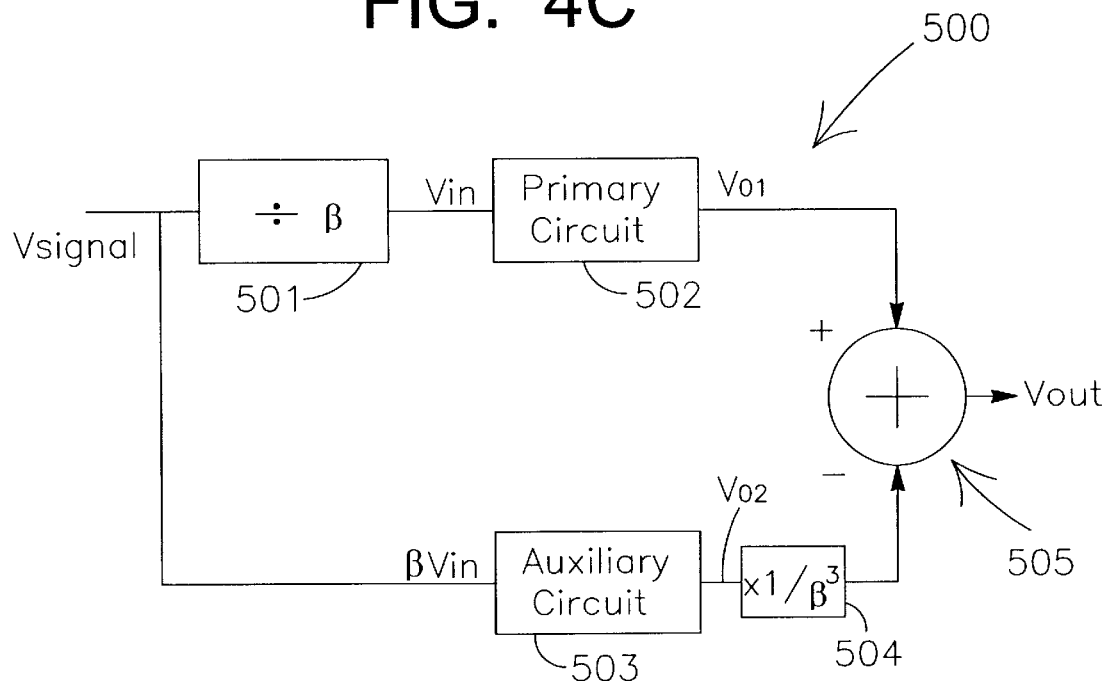
FIG. 4C is another illustrative block diagram representation of an exemplary embodiment of a circuit apparatus according to the present invention generally shown in FIG. 1.

Further, for example, as shown in FIG. 4C, the inputs to the primary circuit 502 can be generated by a linear divider 501. To be consistent, the input to the primary circuit is still normalized to $V_{in}$ so that the input to the auxiliary circuit 503 is $\beta V_{in}$.

For example, a voltage divider circuit may provide a $\beta V_{in}$ input to the auxiliary circuit 54. Such a voltage divider circuit may employ resistors or capacitors for the divider circuit. Such a voltage division circuit for applying $V_{in}$ and $\beta V_{in}$ to primary and auxiliary circuits, respectively, is shown in the linearized active mixer of FIG. 11.

The subtraction 59 of $1/\beta^3$ of the output $V_{o2}$ of the auxiliary circuit 54 (shown generally by block 58) from the output $V_{o1}$ of the primary circuit 52 results in $V_{out}$ for the circuit 50. Such subtraction may be carried out in any manner known to one skilled in the art and the present invention is not limited to only those techniques described herein. For example, such subtraction may be provided by any known divider circuit technique to provide $(1/\beta^3) V_{o2}$ for subtraction from $V_{o1}$.

Figure 4D:
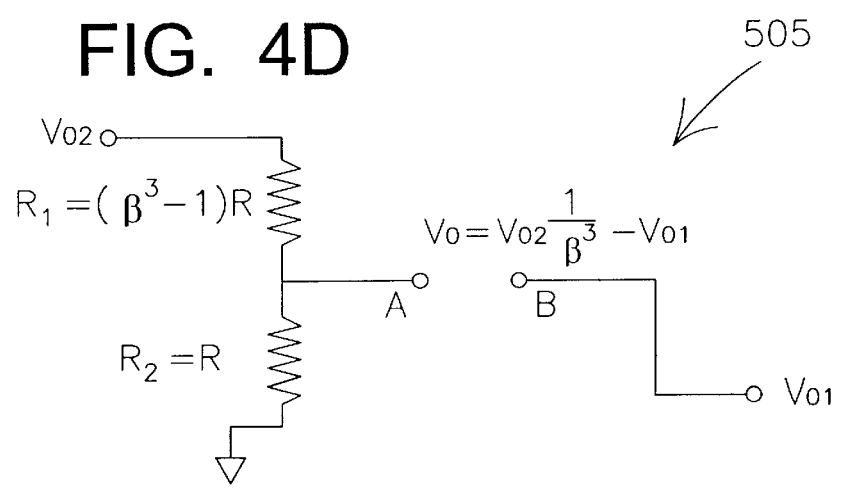
FIG. 4D is an illustrative schematic of an exemplary embodiment of a circuit apparatus to realize output subtraction using the auxiliary circuit shown generally in FIG. 4C.

In one illustrative embodiment of FIG. 4C, the subtraction 505 of $1/\beta^3$ of the output $V_{o2}$ of the auxiliary circuit 503 (shown generally by block 504) from the output $V_{o1}$ of the primary circuit 502 results in $V_{out}$ for the circuit 500. As shown in FIG. 4D, the subtraction employs the use of a resistive voltage divider with the output of the differential potential node A and B is $V_{out} = (1/\beta^3) V_{o2} - V_{o1}$.

Further, the output can also be subtracted in the form of charge or current. For example, such subtraction may be accomplished by providing a ratio of capacitances such as shown in the switched capacitor integrator of FIG. 12, i.e., the ratio of capacitors $C2/C1 = 1/\beta^3$.

Yet further, for example, a current subtraction may be accomplished by an appropriate ratio of cascaded FETs for subtracting $1/\beta^3$ of auxiliary output current from the output current of the primary circuit. Such a design technique is shown in the linearized active mixer of FIG. 11.

Figure 5:
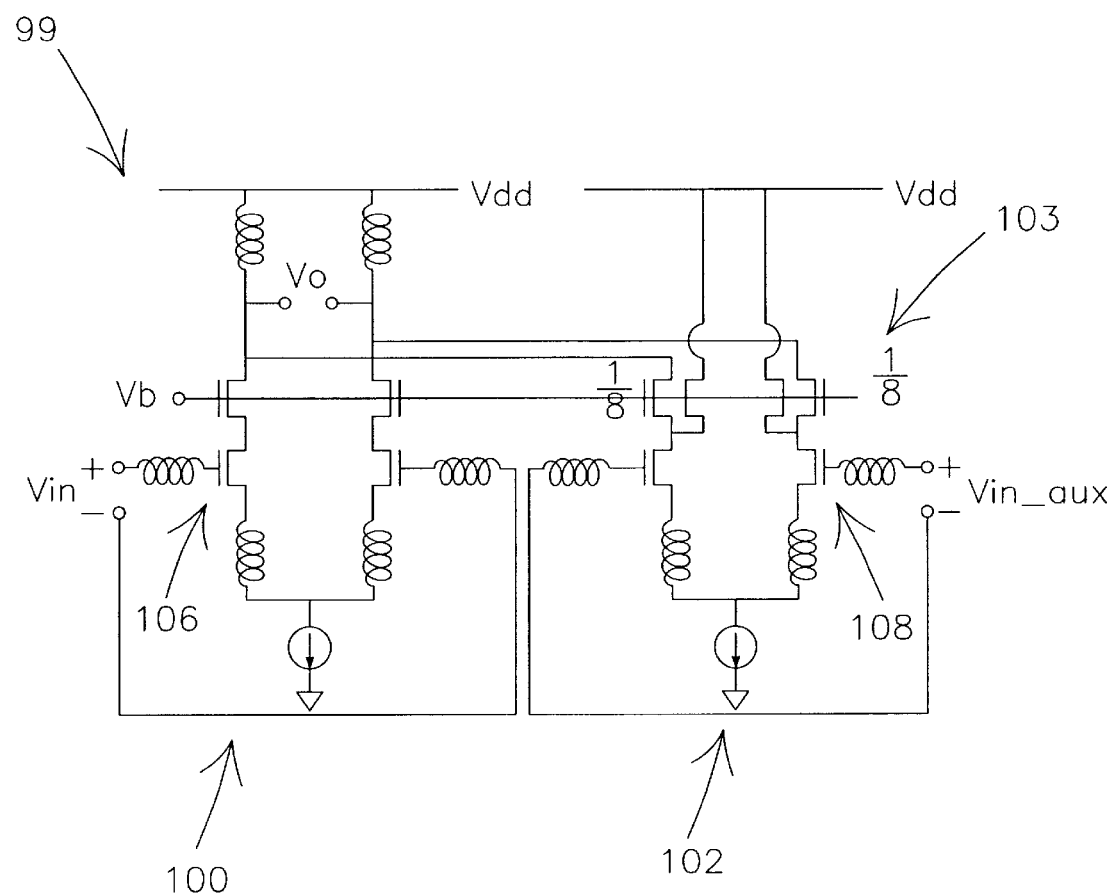
FIG. 5 is a simplified schematic circuit diagram of a low noise amplifier having a configuration according to the present invention as shown generally in FIG. 1.

FIG. 5 shows one illustrative schematic of a low noise amplifier 99 using the cancellation technique described herein. The low noise amplifier 99 includes a primary amplifier circuit 100 and an auxiliary amplifier circuit 102. Input Vin is applied to the primary amplifier circuit 100 while $V_{in\text{-}aux}$ is provided as the input to the auxiliary amplifier circuit 102. Although not shown specifically shown in FIG. 5, $V_{in\text{-}aux}$ is equal to $\beta V_{in}$ as previously described herein.

The primary amplifier circuit 100 and the auxiliary amplifier circuit 102 are substantially functionally identical. The primary amplifier circuit 100 and the auxiliary amplifier circuit 102 in FIG. 5 are preferably, according to this illustrative embodiment, common source inductor-degenerated low noise amplifiers which are commonly known and used extensively due to its superior noise performance. For example, such amplifiers along with other amplifier designs are described in detail in D. K. Schaeffer and T. H. Lee, "A 1.5-V, 1.5-GHz CMOS Low Noise Amplifier," *IEEE Journal of Solid-State Circuits*, vol. 32, no. 5, pp. 745–759, May 1997.

As the present invention may be used with any type of circuit, e.g., switched capacitor, frequency conversion, amplifier, etc., specific details with regard to such circuitry shall not be described herein. It is to be noted that what is important to the present invention is the fact that an auxiliary circuit is provided along with the primary circuit for use in canceling at least a portion of a harmonic of the output from the primary circuit. More particularly, the auxiliary circuit is used to cancel the $3^{rd}$ harmonic.

Preferably, an optimal size for the input NMOS transistor 106, 108 with sufficient drain current to minimize the noise figure is chosen. If it is assumed that the low noise amplifier 99 drives the gates of a following mixer stage in a communication system, for example, as described with reference to FIG. 2, then the low noise amplifier 99 must have sufficient voltage gain to suppress the noise from the mixer and the following stages. In one illustrative embodiment, the primary amplifier circuit 100 is preferably designed to have 2 dB noise figure, 18 dB voltage gain, and +5 dB IIP3.

With $\beta = 2$, the auxiliary amplifier circuit 102 requires one-eighth the gain of the primary amplifier circuit 100 for proper cancellation of the $3^{rd}$ harmonic. In other words, with $V_{inaux} = 2 V_{in}$ (i.e., $\beta = 2$), then the necessary subtraction of the output from the primary amplifier circuit 100 is equal to one-eighth the output of the auxiliary amplifier circuit 102.

As shown in FIG. 5, divider circuit 103 is used to achieve the subtraction of one-eighth the output of the auxiliary amplifier circuit 102 from the output of the primary amplifier circuit 100 to provide $V_0$. In other words, ⅞ of the output of the auxiliary circuit 102 is taken to $V_{dd}$ while ⅛ of the output is subtracted from the output of the primary circuit 100.

To achieve circuit matching, the same input transistor size and same drain current are used, but only one-eighth of the auxiliary output current of the auxiliary amplifier circuit 100 is subtracted from the primary output current of the primary amplifier circuit 100. Therefore, the power consumption is doubled.

As an alternative to the divider circuit 103 described above, the subtraction may be accomplished by selection of appropriate inductance values and FET sizes for the circuits.

Even with 1% matching, the nonlinearity suppression is slightly less than 40 dB due to the nonlinear component of the transistor $r_{ds}$ that is not suppressed by the cancellation technique described herein. The low noise amplifier 99 has an improved IIP3 by 13 dB to +18 dB. Since the noise contribution to the auxiliary amplifier circuit 102 is only being increased by one-eighth of the primary amplifier circuit 100, the noise figures are expected to increase by less than 0.2 dB.

Both the input mismatch and the circuit mismatch of the primary low noise amplifier and the auxiliary low noise amplifier have an impact on the $3^{rd}$ harmonic cancellation. For example, in a system as shown by $$y(x)=A\cdot x\cdot(1+a_2\cdot x^2)$$

the auxiliary low noise amplifier has an input with a phase mismatch of θ and a magnitude mismatch of ε compared to the primary low noise amplifier input, which is given by the following equation:

$$V_{in,aux}\cdot\cos(wt)=V_{in,pri}\cdot(1-\epsilon)\cdot\cos(wt+\theta)$$

In a two-tone test, where both the inputs combine two-tone signals with a phase and magnitude mismatch, the harmonic cancellation results are shown in the following equations:

$$V_{in,pri} = x\cdot[\cos(w_1 t) + \cos(w_2 t)]$$

$$v_{in,aux} = x\cdot(1-\varepsilon)\cdot[\cos(w_1 t+\theta) + \cos(w_2 t+\theta)]$$

$$V_{out} = Ax\{[\cos(w_1 t)-\beta^{-2}(1-\varepsilon)\cos(w_1 t+\theta)] +$$
$$[\cos(w_2 t)-\beta^{-2}(1-\varepsilon)\cos(w_2 t+\theta)]\} +$$
$$\alpha_2 x^3\{[\cos(w_1 t)+\cos(w_2 t)]^3 -$$
$$(1-\varepsilon)^3[\cos(w_1 t+\theta)+\cos(w_2 t+\theta)]^3\}$$

$$V_{out,IM3} = \frac{3}{4} A\alpha_2 x^3 \cdot \left\{ \begin{array}{l} \cos[(2w_1-w_2)t]-(1-\varepsilon)^3\cos[(2w_1-w_2)t+\theta] + \\ \cos[(2w_2-w_1)t]-(1-\varepsilon)^3\cos[(2w_2-w_1)t+\theta] \end{array} \right\}$$

The $3^{rd}$ harmonic cancellation factor p is defined as a ratio of the output intermodulation signal of the primary path, $V_{pri,IM3}$, to the output intermodulation signal with cancellation, $V_{out,IM3}$, as shown below:

$$p = \frac{V_{pri,IM3}}{V_{out,IM3}}$$
$$= \frac{1}{1-(1-\varepsilon)^3\cos\theta}$$

Figure 6:
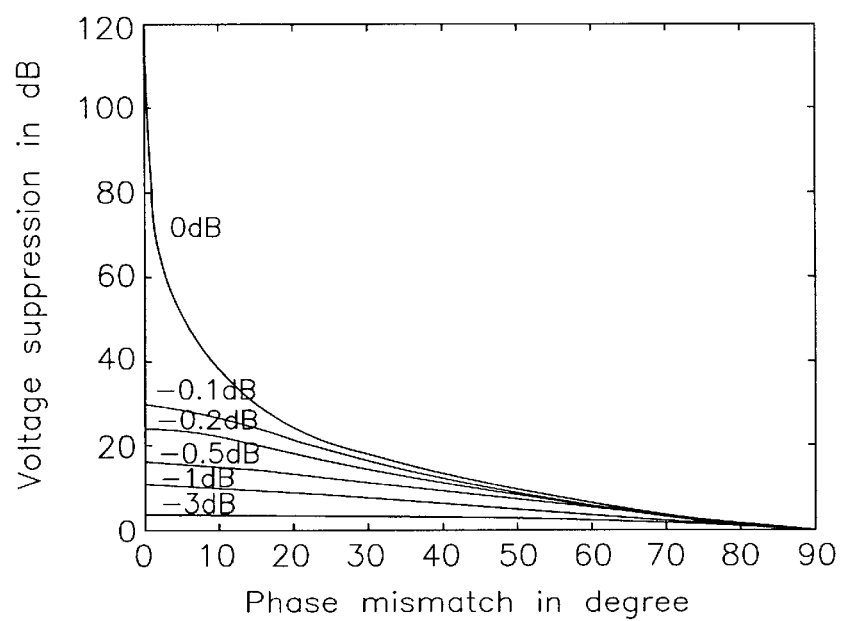
FIG. 6 and FIG. 7 are graphs showing the impact of input mismatch on intermodulation suppression and the impact of circuit mismatch on intermodulation suppression, respectively, for a low noise amplifier such as that shown in FIG. 5.
Figure 7:
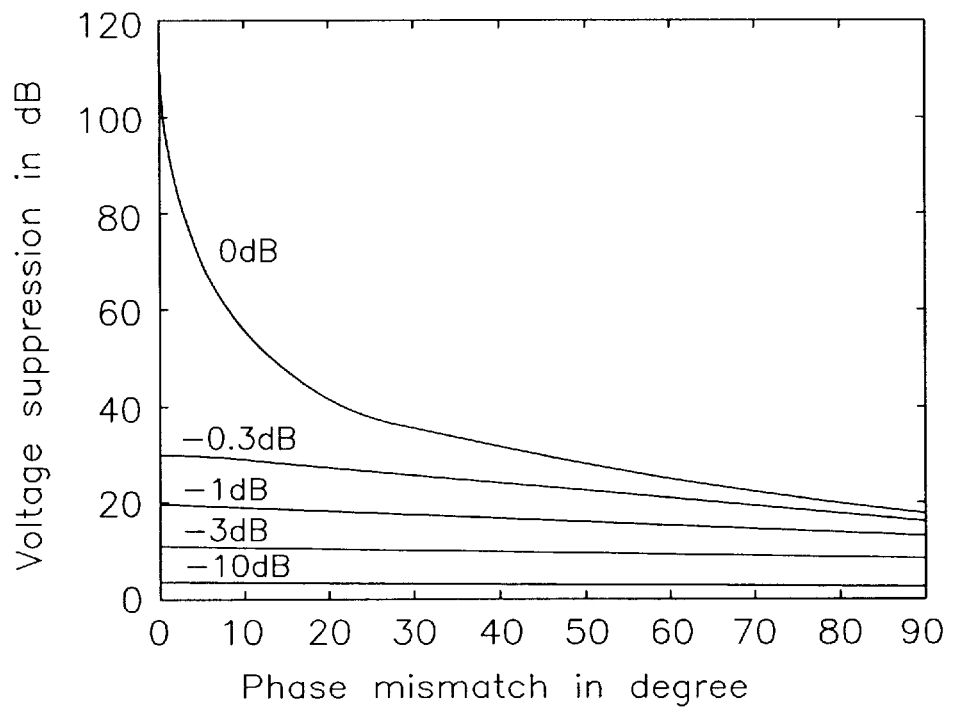

FIG. 6 shows the intermodulation signal suppression versus the input mismatch. 30 dB suppression can be achieved within 0.1 dB magnitude mismatch and 2 degree phase mismatch.

The impact of circuit mismatch on $3^{rd}$ harmonic cancellation can be derived similarly. If the magnitude mismatch of the circuit gain is δ and its phase mismatch is φ, the $3^{rd}$ harmonic cancellation factor is given by the following:

$$A_{aux} = A_{pri}\cdot e^{j\phi} = A\cdot e^{j\phi}$$

$$p = \frac{1}{1-(1-\delta)\cos\frac{\phi}{3}}$$

30 dB output linearity improvement requires less than 0.3 dB magnitude mismatch and less than 6 degree phase mismatch. The curve of intermodulation suppression vs. gain mismatch is plotted in FIG. 7.

Figure 8:
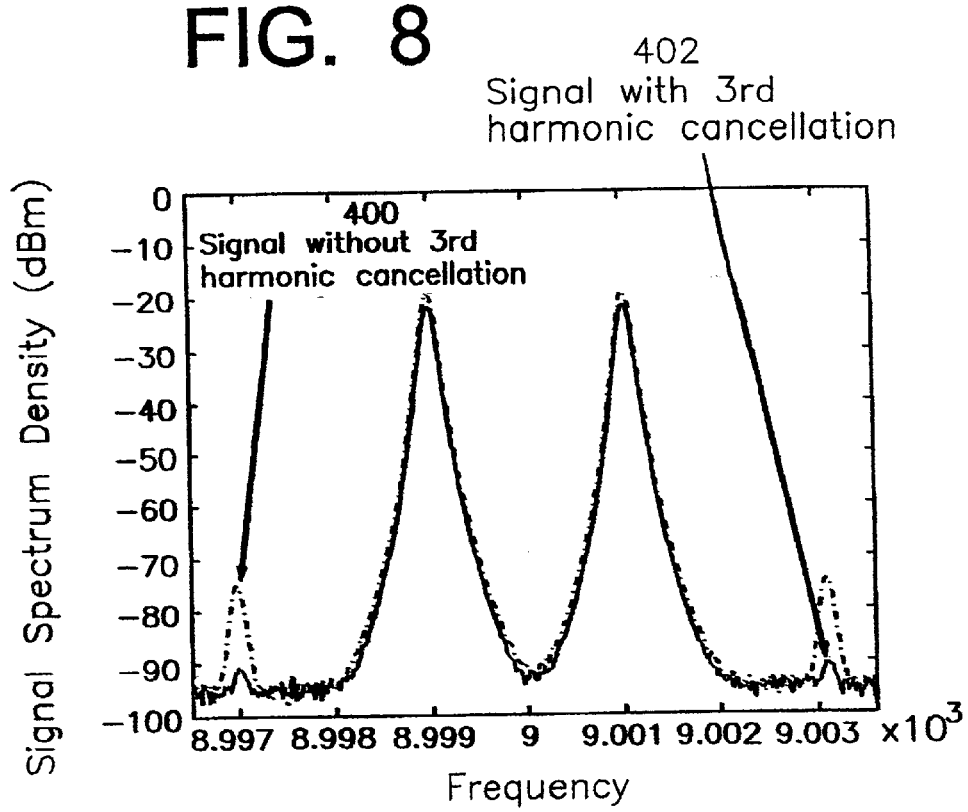
FIG. 8 shows a comparison of spectral density with and without $3^{rd}$ harmonic cancellation according to the present invention for a low noise amplifier such as that shown in FIG. 5.
Figure 9:
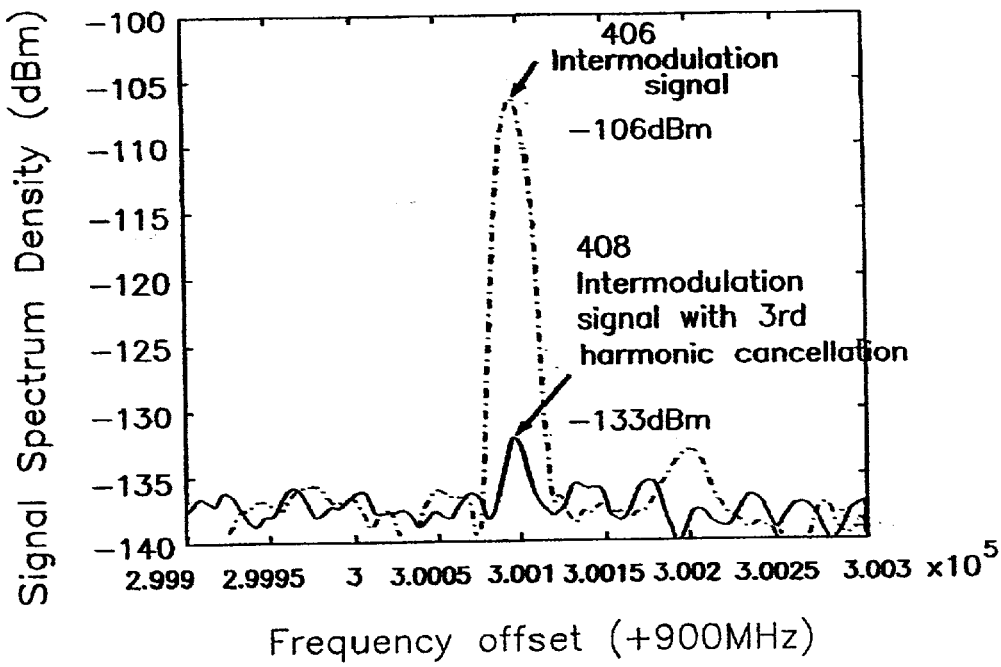
FIG. 9 shows a comparison of the spectral density of the intermodulation signal with and without $3^{rd}$ harmonic cancellation for an amplifier such as that shown in FIG. 5.
Figure 10:
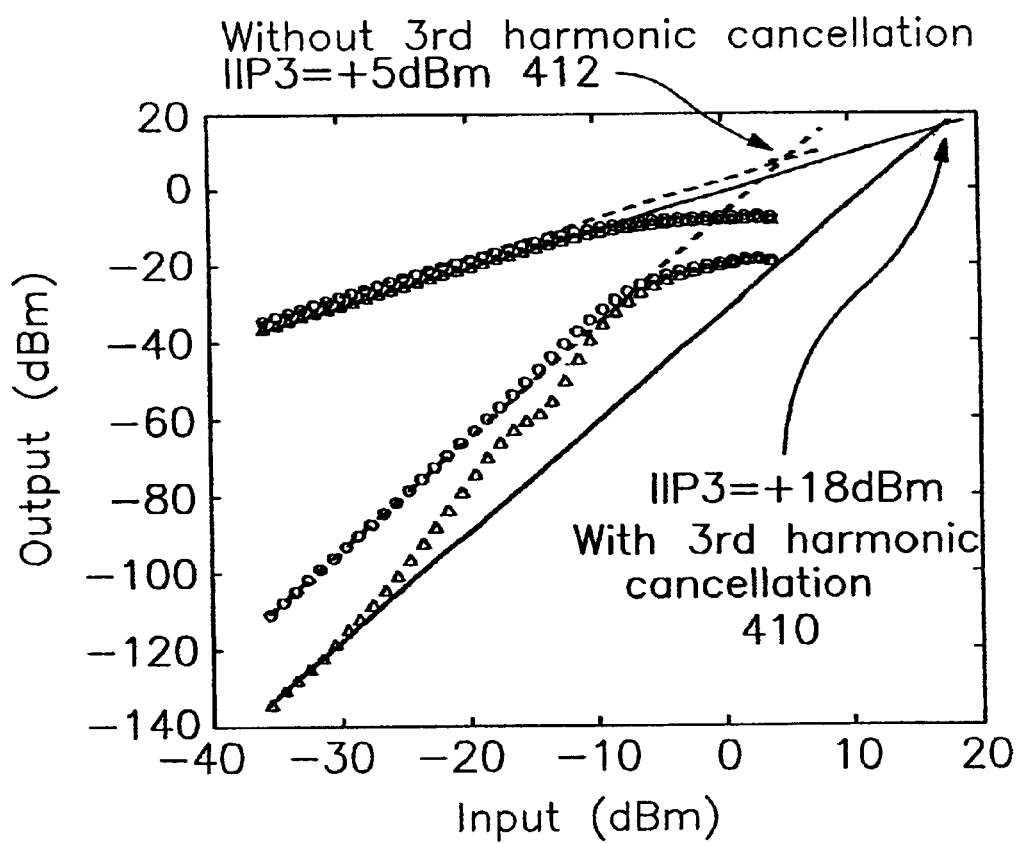
FIG. 10 shows a comparison of IIP3 with and without $3^{rd}$ harmonic cancellation according to the present invention for a low noise amplifier such as that shown in FIG. 5.

In one illustrative example, a two-tone technique has been used to measure IIP3 in a constructed circuit such as shown in FIG. 5. A comparison of the output spectral responses with (see reference numeral 402) and without (see reference numeral 400) $3^{rd}$ harmonic cancellation is shown in FIG. 8 with a relatively large input of −22 dBm due to the limited dynamic range of a spectrum analyzer used for the process. FIG. 9 gives the spectral comparison of the intermodulation signal for a relatively small input of −32 dBm. It should be noted that the intermodulation product without cancellation (see reference numeral 406) is suppressed by 27 dB when cancellation is used (see reference numeral 408) for this input level. The measurement results of IIP3 are plotted in FIG. 10. The measured IIP3 without $3^{rd}$ harmonic cancellation (see reference numeral 412) is +5 dBm, and the measured IIP3 with $3^{rd}$ harmonic cancellation (see reference numeral 410) is +18 dBm. It should be noted that the $3^{rd}$ harmonic has been suppressed sufficiently and that for high input levels the slope of the intermodulation product increases, which suggests a higher order power contribution to the nonlinearity. For all input lower than −25 dBm our low noise amplifier maintains a very high IIP3 level, which makes our low noise amplifier attractive to most high performance wireless communication systems.

As previously described, the cancellation techniques described herein may be used with circuits other than amplifiers such as low noise amplifiers. For example, as shown in FIGS. 11 and 12, such cancellation techniques may be used in frequency conversion circuits (e.g., as illustrated by the linearized active mixer 200 shown in FIG. 11) and may be used in switched capacitor circuits (e.g., as illustrated by the linear switched capacitor integrator as shown in FIG. 12).

Figure 11:
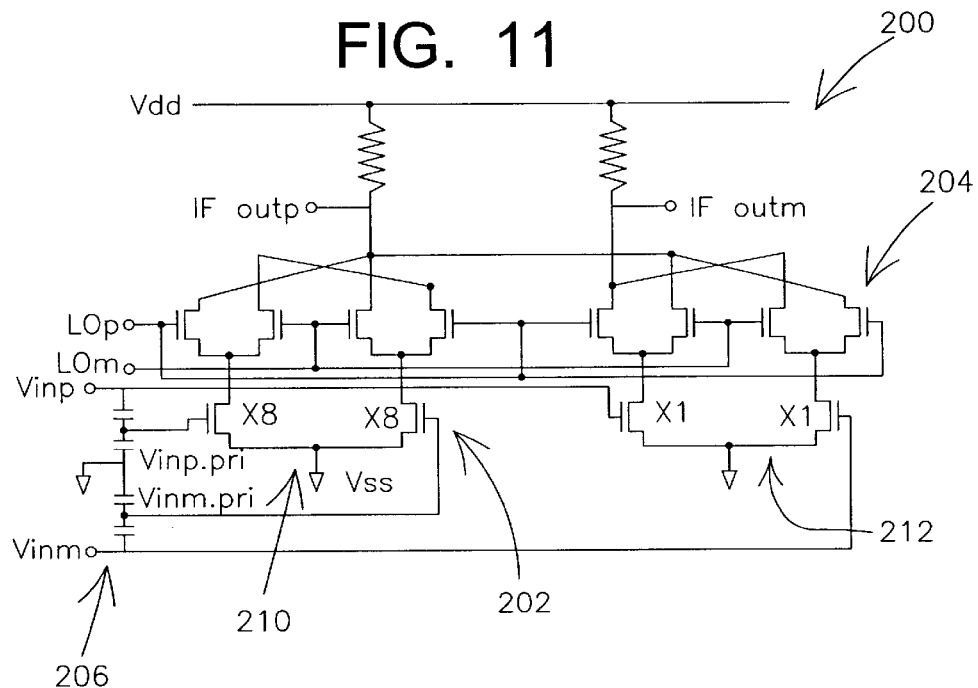
FIG. 11 is an illustrative schematic of one exemplary embodiment of the generalized circuit apparatus shown in FIG. 1 taking the form of a linearized active mixer.
Figure 12:
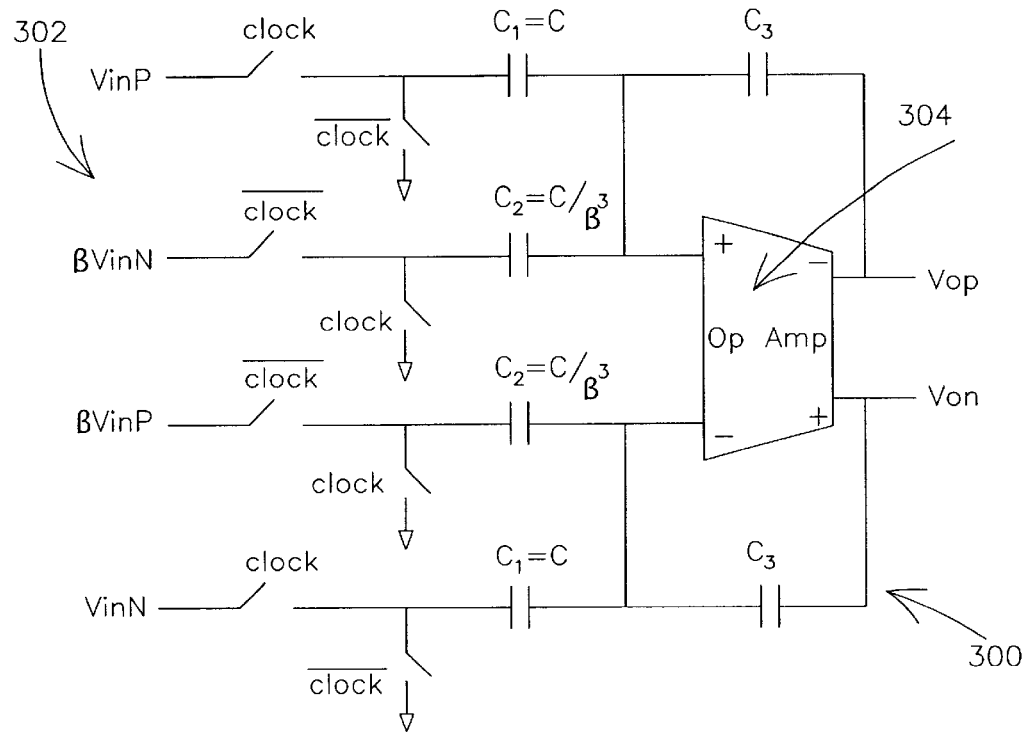
FIG. 12 is an illustrative schematic of another exemplary embodiment of a circuit apparatus as generally shown in FIG. 1 taking the form of a linear switched capacitor integrator.

The active mixer 200 shown in FIG. 11 includes primary mixer circuit 202 and auxiliary mixer circuit 204. As the mixer circuits are generally known in the art, specific details with respect thereto shall not be provided as any circuit design is suitable. However, it is noted that the important characteristic herein is that the auxiliary mixer circuit 204 is used to subtract the $3^{rd}$ harmonic from the output of primary mixer circuit 202.

The voltage divider circuit 206 provides an input $V_{inp,pri}/V_{inm,pri}$ that is half that of the input $V_{inp}/V_{inm}$ provided to the auxiliary mixer circuit 204. In other words, β=2. The divider circuit 206 is implemented in FIG. 11 as a capacitive voltage divider. However, any other type of gain circuit for providing the appropriate voltages to the primary mixer circuit 202 and the auxiliary mixer circuit 204 may be used.

As shown in FIG. 11, the mixer circuits receive differential inputs as described above, and differential voltage $LO_P/LO_M$ as the local oscillator (LO) signal. The differential output $IF_{OUTP}/IF_{OUTM}$ is shown at the top of the circuit. As is well known in the art, a plurality of MOS transistors are used to implement the mixers. Gain resistors couple the circuit components to the supply voltage (VDD).

By using FETs 210, 212 with different but ratioed sizes in the primary mixer circuit 202 and the auxiliary mixer circuit 204, the two mixer circuits have the same transfer characteristics, i.e., nonlinear characteristics. For example, as shown below, such circuits have the same nonlinear characteristics $V_{in,aux}(f_{RF})\cdot[1+\alpha_1\cdot V_{in,aux}^2(f_{RF})]$ but different gain characteristics (e.g., "A" for the primary circuit 202 and "$(1/\beta^3)A$" for the auxiliary circuit 204). In other words, the FETs of the auxiliary mixer 212 are all $1/\beta^3$ times of the FETs of the primary mixer 202, and such gain characteristics are given below:

$$i_{o,pri}(f_{IF}) = A\cdot V_{in,pri}(f_{RF})\cdot[1+\alpha_1\cdot V_{in,pri}^2(f_{RF})]$$

$$i_{o,aux}(f_{IF}) = \frac{1}{\beta^3} A\cdot V_{in,aux}(f_{RF})\cdot[1+\alpha_1\cdot V_{in,aux}^2(f_{RF})]$$

As described above, the input magnitude for the primary mixer circuit 202 is half that for the auxiliary mixer circuit 204. Further, additionally, the output current for the primary mixer circuit 202 is eight times the output current for the auxiliary mixer circuit 204. Therefore, the output of the combined mixer is linearized as:

$$V_O = A \cdot 0.75 \cdot (V_{inp,pri} - V_{inm,pri}) \cdot R_O$$

The linear switched capacitor integrator 300, as shown in FIG. 12, includes the implementation of a primary and auxiliary circuit by using two phases of the clock to switch the inputs with different amplitudes. In other words, during one phase of the clock 302, inputs $V_{inP}/V_{inN}$ are provided for the functioning of a primary circuit, whereas during the other phase of the clock 302, $V_{inP}/V_{inN}$ are provided with gain β at the inputs to opamp 304 for operation of the auxiliary circuit during the second phase of the clock 302. The different capacitor sizes are used to provide the correct scale factor to cancel the $3^{rd}$ harmonic. In other words, the ratio of $C_2/C_1 = 1/\beta^3$ provides an output having the $3^{rd}$ harmonic subtracted.

The input-out nonlinearity for this circuit is shown below:

$$Q_c = V_{in} \cdot C \cdot (1 + \alpha_1 \cdot V_{in}^2)$$

By using the two phases of the clock to switch the inputs with different amplitudes, and by using the different capacitor sizes to provide the correct scale factor to cancel distortion effect, the voltage integration can be expressed as:

$$\Delta V_o = \Delta Q_c / C_2 = V_{in} \cdot \left(1 - \frac{1}{\beta^2}\right) \cdot \frac{C_1}{C_2}.$$

All references cited herein are incorporated in their entirety as if each were incorporated separately. This invention has been described with reference to illustrative embodiments and is not meant to be construed in a limiting sense. Various modifications of the illustrative embodiments, as well as additional embodiments of the invention, will be apparent to persons skilled in the art upon reference to this description.

What is claimed is:

1. A method to improve linearity in electrical circuitry, the method comprising:
   providing a primary circuit;
   providing at least one auxiliary circuit, wherein the at least one auxiliary circuit is substantially functionally identical to the primary circuit, and further wherein the at least one auxiliary circuit has a gain that is different than a gain of the primary circuit;
   applying a first input signal to the primary circuit resulting in a first output signal;
   applying a second input signal to the auxiliary circuit resulting in a second output signal, wherein the second input signal has an amplitude that is different than the first input signal; and
   canceling at least a portion of at least one harmonic of the first output signal using the second output signal.

2. The method of claim 1, wherein canceling at least a portion of at least one harmonic of the first output signal using the second output signal comprises canceling at least a portion of a third harmonic of the first output signal using the second output signal.

3. The method of claim 1, wherein the second input signal is β times the first input signal.

4. The method of claim 3, wherein the gain of the auxiliary circuit is $1/\beta^3$ of the gain of the primary circuit.

5. The method of claim 1, wherein the at least one auxiliary circuit comprises multiple auxiliary circuits, each of the multiple auxiliary circuits used to cancel at least a portion of a harmonic of the first output signal of the primary circuit.

6. The method of claim 1, wherein each of the primary circuit and the at least one auxiliary circuit comprises a differentially designed circuit.

7. The method of claim 1, wherein each of the primary circuit and the at least one auxiliary circuit comprises an amplifier circuit.

8. The method of claim 1, wherein each of the primary circuit and the at least one auxiliary circuit comprise a frequency conversion circuit.

9. The method of claim 1, wherein each of the primary circuit and the at least one auxiliary circuit comprise a switched capacitor circuit.

10. The method of claim 1, wherein the method further comprises applying the first output signal having the at least a portion of at least one harmonic cancelled therefrom to a component in a communication system.

11. A circuit apparatus comprising:
    a primary circuit operable to receive a first input signal and generate a first output signal; and
    at least one auxiliary circuit, wherein the at least one auxiliary circuit is substantially functionally identical to the primary circuit, wherein the at least one auxiliary circuit has a gain that is different from a gain of the primary circuit, wherein the auxiliary circuit is operable to receive a second input signal and generate a second output signal, wherein the second input signal has an amplitude that is different than the first input signal, and further wherein the auxiliary circuit is connected to the primary circuit so as to result in cancellation of at least a portion of at least one harmonic of the first output signal using the second output signal.

12. The circuit apparatus of claim 11, wherein the auxiliary circuit is connected to the primary circuit so as to result in cancellation of at least a portion of a third harmonic of the first output signal using the second output signal.

13. The circuit apparatus of claim 11, wherein the circuit apparatus comprises a gain circuit that provides β times gain to the first input signal resulting in the second input signal.

14. The circuit apparatus of claim 11, wherein the circuit apparatus comprises a gain circuit that provides the first input signal by dividing a signal provided as the second input signal by β such that the ratio of the second input signal to the first input signal is β.

15. The circuit apparatus of claim 11, wherein a ratio of the second input signal to the first input signal is β, wherein the gain of the auxiliary circuit is $1/\beta^3$ of the gain of the primary circuit.

16. The circuit apparatus of claim 11, wherein the at least one auxiliary circuit comprises multiple auxiliary circuits, each of the multiple auxiliary circuits used to cancel at least a portion of a harmonic of the first output signal of the primary circuit.

17. The circuit apparatus of claim 11, wherein each of the primary circuit and the at least one auxiliary circuit comprises a differentially designed circuit.

18. The circuit apparatus of claim 11, wherein each of the primary circuit and the at least one auxiliary circuit comprises an amplifier circuit.

19. The circuit apparatus of claim 11, wherein each of the primary circuit and the at least one auxiliary circuit comprise a frequency conversion circuit.

20. The circuit apparatus of claim 11, wherein each of the primary circuit and the at least one auxiliary circuit comprise a switched capacitor circuit.

21. The circuit apparatus of claim 11, wherein the circuit apparatus is operably connected with one or more components of a communication system.

22. A method to improve linearity in electrical circuitry, the method comprising:

provinding a primary circuit;

providing at least one auxiliary circuit, wherein the at least one auxiliary circuit is substantially functionally identical to the primary circuit, and further wherein the at least one auxiliary circuit has a gain that is different than a gain of the primary circuit;

applying an input signal to the primary circuit resulting in an output signal; and using the at least one auxiliary circuit to cancel at least a portion of at least one harmonic of the output signal of the primary circuit.

23. The method of claim 22, wherein each of the primary circuit and the at least one auxiliary circuit comprise an amplifier circuit.

24. The method of claim 22, wherein each of the primary circuit and the at least one auxiliary circuit comprise a frequency conversion circuit.

25. The method of claim 22, wherein each of the primary circuit and the at least one auxiliary circuit comprise a switched capacitor circuit.

26. The method of claim 22, wherein using the at least one auxiliary circuit to cancel at least a portion of at least one harmonic of the output signal of the primary circuit comprises using the auxiliary circuit to cancel at least a portion of a third harmonic of the output signal.

27. A method to improve linearity in electrical circuitry, the method comprising:

providing a primary amplifier circuit;

providing an auxiliary amplifier circuit, wherein the auxiliary amplifier circuit is substantially functionally identical to the primary amplifier circuit, and further wherein the at least one auxiliary amplifier circuit has a gain that is $1/\beta^3$ of a gain of the primary circuit;

applying a first input signal to the primary amplifier circuit resulting in a first output signal;

applying a second input signal to the auxiliary amplifier circuit resulting in a second output signal, wherein a ratio of the second input signal to the first input signal is $\beta$; and canceling at least a portion of a third harmonic of the first output signal by subtracting the second output signal from the first output signal.

28. The method of claim 27, wherein the method further comprises applying the first output signal having the at least a portion of a third harmonic of the first output signal cancelled therefrom to a component in a communication system.

29. A method to improve linearity in electrical circuitry, the method comprising:

providing a primary mixer circuit;

providing an auxiliary mixer circuit, wherein the auxiliary mixer circuit is substantially functionally identical to the primary mixer circuit;

applying a first input signal to the primary mixer circuit resulting in a first output signal;

applying a second input signal to the auxiliary mixer circuit resulting in a second output signal, wherein the second input signal has an amplitude that is different than the first input signal; and canceling at least a portion of a third harmonic of the first output signal using the second output signal.

30. The method of claim 29, wherein the method further comprises applying the first output signal having the at least a portion of a third harmonic of the first output signal cancelled therefrom to a component in a communication system.

31. The method of claim 29, wherein the auxiliary mixer circuit has a gain that is different than a gain of the primary mixer circuit.

32. The method of claim 31, wherein the second input signal is $\beta$ times the first input signal.

33. The method of claim 32, wherein the gain of the auxiliary circuit is $1/\beta^3$ of the gain of the primary circuit.

34. A method to improve linearity in electrical circuitry, the method comprising:

providing an integrated circuit comprising a primary circuit and at least one auxiliary circuit, wherein the at least one auxiliary circuit is substantially functionally identical to the primary circuit;

applying a first input signal to the primary circuit resulting in a first output signal;

applying a second input signal to the auxiliary circuit resulting in a second output signal, wherein the second input signal has an amplitude that is different than the first input signal; and canceling at least a portion of at least one harmonic of the first output signal using the second output signal.

35. The method of claim 34, wherein each of the primary circuit and the at least one auxiliary circuit comprises a differentially designed circuit.

36. The method of claim 34, wherein each of the primary circuit and the at least one auxiliary circuit comprises an amplifier circuit.

37. The method of claim 34, wherein each of the primary circuit and the at least one auxiliary circuit comprise a frequency conversion circuit.

38. The method of claim 34, wherein each of the primary circuit and the at least one auxiliary circuit comprise a switched capacitor circuit.

39. The method of claim 34, wherein the method further comprises applying the first output signal having the at least a portion of at least one harmonic cancelled therefrom to a component in a communication system.

40. The method of claim 34, wherein the at least one auxiliary circuit has a gain that is different from a gain of the primary circuit.

41. The method of claim 34, wherein canceling at least a portion of at least one harmonic of the first output signal using the second output signal comprises canceling at least a portion of a third harmonic of the first output signal using the second output signal.

42. The method of claim 34, wherein the second input signal is $\beta$ times the first input signal, and further wherein a gain of the at least one auxiliary circuit is $1/\beta^3$ of a gain of the primary circuit.

43. The method of claim 34, wherein the at least one auxiliary circuit comprises multiple auxiliary circuits, each of the multiple auxiliary circuits used to cancel at least a portion of a harmonic of the first output signal of the primary circuit.

44. A circuit apparatus comprising an integrated circuit, wherein the integrated circuit comprises a primary circuit operable to receive a first input signal and generate a first output signal and at least one auxiliary circuit, wherein the at least one auxiliary circuit is substantially functionally identical to the primary circuit, wherein the auxiliary circuit is operable to receive a second input signal and generate a second output signal, wherein the second input signal has an amplitude that is different than the first input signal, and further wherein the auxiliary circuit is connected to the primary circuit so as to result in cancellation of at least a portion of at least one harmonic of the first output signal using the second output signal.

45. The circuit apparatus of claim 44, wherein each of the primary circuit and the at least one auxiliary circuit comprises a differentially designed circuit.

46. The circuit apparatus of claim 44, wherein each of the primary circuit and the at least one auxiliary circuit comprises an amplifier circuit.

47. The circuit apparatus of claim 44, wherein each of the primary circuit and the at least one auxiliary circuit comprise a frequency conversion circuit.

48. The circuit apparatus of claim 44, wherein each of the primary circuit and the at least one auxiliary circuit comprise a switched capacitor circuit.

49. The circuit apparatus of claim 44, wherein the circuit apparatus is operably connected with one or more components of a communication system.

50. The circuit apparatus of claim 44, wherein the auxiliary circuit is connected to the primary circuit so as to result in cancellation of at least a portion of a third harmonic of the first output signal using the second output signal.

51. The circuit apparatus of claim 44, wherein the circuit apparatus comprises a gain circuit that provides $\beta$ times gain to the first input signal resulting in the second input signal.

52. The circuit apparatus of claim 44, wherein the circuit apparatus comprises a gain circuit that provides the first input signal by dividing a signal provided as the second input signal by $\beta$ such that a ratio of the second input signal to the first input signal is $\beta$.

53. The circuit apparatus of claim 44, wherein a ratio of the second input signal to the first input signal is $\beta$, and further a gain of the auxiliary circuit is $1/\beta^3$ of a gain of the primary circuit.

54. The circuit apparatus of claim 44, wherein the at least one auxiliary circuit comprises multiple auxiliary circuits, each of the multiple auxiliary circuits used to cancel at least a portion of a harmonic of the first output signal of the primary circuit.

55. The circuit apparatus of claim 44, wherein the at least one auxiliary circuit has a gain that is different from a gain of the primary circuit.

56. A method to improve linearity in electrical circuitry, the method comprising:
providing an integrated circuit comprising a primary circuit and at least one auxiliary circuit, wherein the at least one auxiliary circuit is substantially functionally identical to the primary circuit;
applying an input signal to the primary circuit resulting in an output signal; and
using the at least one auxiliary circuit to cancel at least a portion of at least one harmonic of the output signal of the primary circuit.

57. The method of claim 56, wherein each of the primary circuit and the at least one auxiliary circuit comprises a differentially designed circuit.

58. The method of claim 56, wherein each of the primary circuit and the at least one auxiliary circuit comprise an amplifier circuit.

59. The method of claim 56, wherein each of the primary circuit and the at least one auxiliary circuit comprise a frequency conversion circuit.

60. The method of claim 56, wherein each of the primary circuit and the at least one auxiliary circuit comprise a switched capacitor circuit.

61. The method of claim 56, wherein using the at least one auxiliary circuit to cancel at least a portion of at least one harmonic of the output signal of the primary circuit comprises using the auxiliary circuit to cancel at least a portion of a third harmonic of the output signal.

62. A method to improve linearity in electrical circuitry, the method comprising:
providing an integrated circuit, wherein the integrated circuit comprises a primary amplifier circuit and an auxiliary amplifier circuit, wherein the auxiliary amplifier circuit is substantially functionally identical to the primary amplifier circuit, and further wherein a gain of the auxiliary circuit is $1/\beta^3$ a gain of the primary circuit;
applying a first input signal to the primary amplifier circuit resulting in a first output signal;
applying a second input signal to the auxiliary amplifier circuit resulting in a second output signal, wherein a ratio of the second input signal to the first input signal is $\beta$; and
canceling at least a portion of a third harmonic of the first output signal by subtracting the second output signal from the first output signal.

63. The method of claim 62, wherein each of the primary circuit and the at least one auxiliary circuit comprises a differentially designed circuit.

64. The method of claim 62, wherein the method further comprises applying the first output signal having the at least a portion of a third harmonic of the first output signal cancelled therefrom to a component in a communication system.

65. A method to improve linearity in electrical circuitry, the method comprising:
providing a primary circuit;
applying a first input signal to the primary circuit resulting in a first output signal;
providing multiple auxiliary circuits, wherein each of the multiple auxiliary circuits is substantially functionally identical to the primary circuit;
applying an auxiliary input signal to each of the multiple auxiliary circuits resulting in auxiliary output signals from each of the multiple auxiliary circuits, wherein each of the auxiliary input signals has an amplitude that is different than the first input signal; and
using the auxiliary output signal from each of the multiple auxiliary circuits to cancel at least a portion of a harmonic of the first output signal of the primary circuit.

66. The method of claim 65, wherein using the auxiliary output signal from each of the multiple auxiliary circuits to cancel at least a portion of a harmonic of the first output signal of the primary circuit comprises canceling at least a portion of a third harmonic of the first output signal.

67. The method of claim 65, wherein each of the primary circuit and the multiple auxiliary circuits comprises a differentially designed circuit.

68. The method of claim 65, wherein each of the primary circuit and the multiple auxiliary circuits comprises one of an amplifier circuit, a frequency conversion circuit, and a switched capacitor circuit.

69. The method of claim 65, wherein the method further comprises applying the first output signal having the at least a portion of at least one harmonic cancelled therefrom to a component in a communication system.

70. The method of claim 65, wherein each of the multiple auxiliary circuits has a gain that is different from a gain of the primary circuit.

71. A circuit apparatus comprising:
- a primary circuit operable to receive a first input signal and generate a first output signal; and
- multiple auxiliary circuits, wherein each of the multiple auxiliary circuits is substantially functionally identical to the primary circuit; wherein each of the multiple auxiliary circuits is operable to receive an auxiliary input signal and generate an auxiliary output signal, wherein each of the auxiliary input signals has an amplitude that is different than the first input signal, and further wherein each of the multiple auxiliary circuits is connected to the primary circuit so as to result in cancellation of at least a portion of a harmonic of the first output signal of the primary circuit.

72. The circuit apparatus of claim 71, wherein at least one of the multiple auxiliary circuits is connected to the primary circuit so as to result in cancellation of at least a portion of a third harmonic of the first output signal.

73. The circuit apparatus of claim 71, wherein each of the primary circuit and the multiple auxiliary circuits comprises a differentially designed circuit.

74. The circuit apparatus of claim 71, wherein each of the primary circuit and the multiple auxiliary circuits comprises one of an amplifier circuit, a frequency conversion circuit, and a switched capacitor circuit.

75. The circuit apparatus of claim 71, wherein the circuit apparatus is operably connected with one or more components of a communication system.

* * * * *